(12) United States Patent
Browder

(10) Patent No.: US 6,324,229 B1
(45) Date of Patent: Nov. 27, 2001

(54) SELF-CLOCKING AUTOMATIC DIGITAL LEVEL CONTROL METHOD AND APPARATUS

(75) Inventor: Charles E. Browder, Boca Raton, FL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/075,363

(22) Filed: May 11, 1998

(51) Int. Cl.[7] .................................................. H04L 27/08
(52) U.S. Cl. ................... 375/345; 455/234.1; 455/240.1; 455/245.1
(58) Field of Search ..................................... 375/344, 345; 455/232.1, 234.2, 230.1, 245.1, 241.1, 239.1, 249.1, 250.1; 381/102, 104, 107, 108

(56) References Cited

U.S. PATENT DOCUMENTS

| | | | |
|---|---|---|---|
| 4,635,103 | | 1/1987 | Steckler et al. .......................... 358/27 |
| 4,910,797 | | 3/1990 | Min et al. .............................. 455/249 |
| 5,117,201 | * | 5/1992 | Luther ................................... 330/279 |
| 5,347,534 | * | 9/1994 | Akazawa et al. .......................... 375/1 |
| 5,515,004 | | 5/1996 | Alford et al. .......................... 330/254 |
| 5,672,999 | * | 9/1997 | Ferrer et al. .......................... 330/138 |
| 5,745,531 | * | 4/1998 | Sawahashi et al. .................... 375/345 |
| 5,771,301 | * | 6/1998 | Fuller et al. ........................... 381/107 |
| 5,896,423 | * | 4/1999 | Okamoto ............................... 375/345 |
| 5,901,347 | * | 5/1999 | Chambers et al. ................. 455/234.1 |
| 5,982,821 | * | 11/1999 | Kingston et al. ..................... 375/326 |
| 5,987,075 | * | 11/1999 | Abe et al. ............................. 375/334 |
| 6,002,723 | * | 12/1999 | Chethik ................................. 375/317 |
| 6,038,435 | * | 3/2000 | Zhang ............................... 455/234.1 |
| 6,049,361 | * | 4/2000 | Kim ...................................... 348/678 |
| 6,122,331 | * | 9/2000 | Dumas ................................. 375/345 |

OTHER PUBLICATIONS

Tom Pask, Audio Companding, *All About*, Nov. 1985, pp. 67–69.

* cited by examiner

*Primary Examiner*—Stephen Chin
*Assistant Examiner*—Dac V. Ha
(74) *Attorney, Agent, or Firm*—Andrew S. Fuller; Frank M. Scutch, III

(57) ABSTRACT

An automatic digital level control adjuster (310) processes an analog input signal (305) to adjust its signal level, based on input (311) from a digital module (330) that is clocked by a clock signal (325) derived from the analog signal (305). Preferably, the input (311) from the digital module (330) changes at a rate dependent on the clock signal (325), and such changes are made during crossovers of the analog signal across a predetermined zero reference threshold.

30 Claims, 4 Drawing Sheets

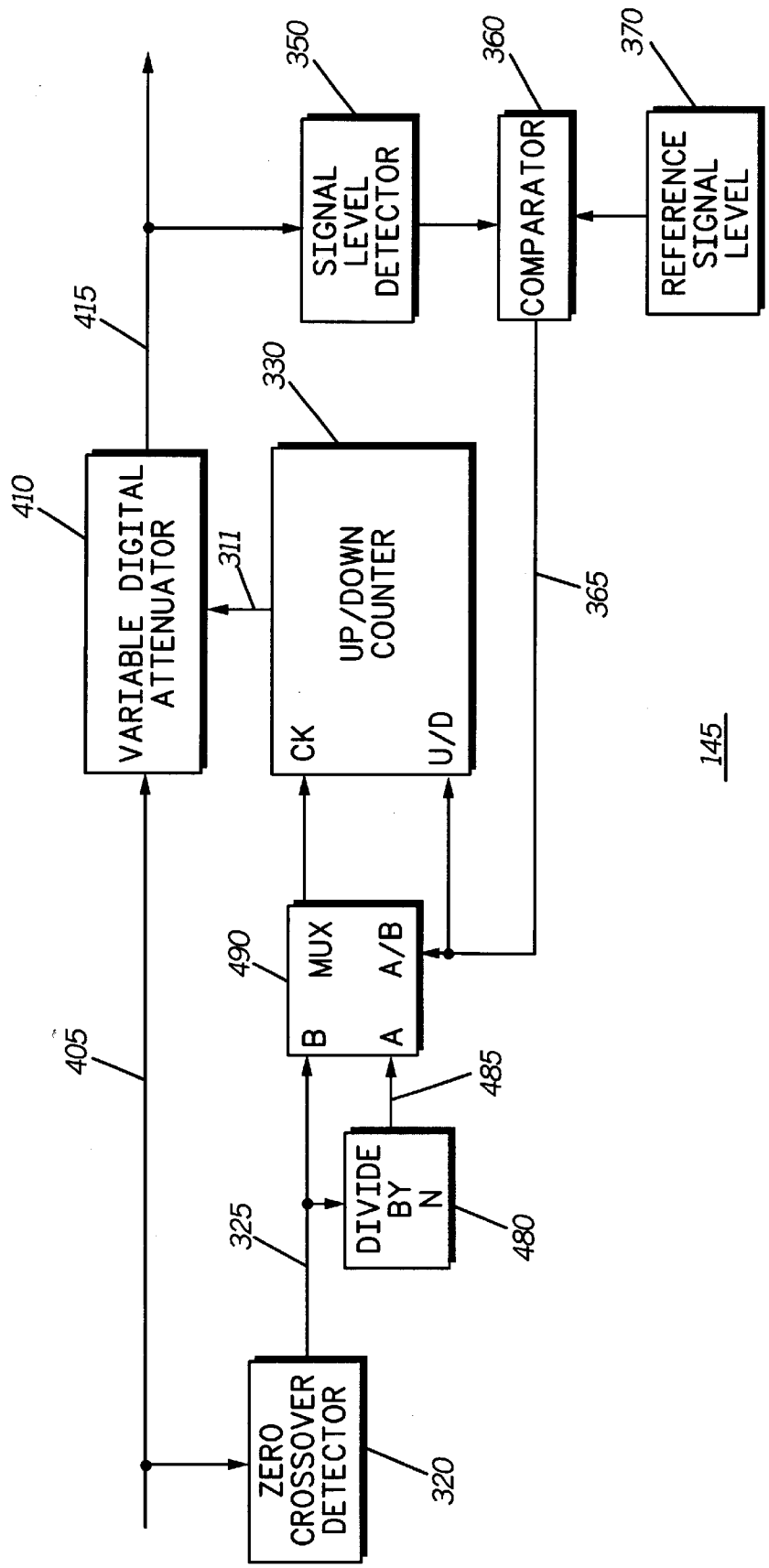

SELF-CLOCKING AUTOMATIC DIGITAL LEVEL CONTROL METHOD AND APPARATUS

TECHNICAL FIELD

This invention relates in general to electrical circuits with automatic level or gain control, and more particularly, to automatic digital level control.

BACKGROUND OF THE INVENTION

Automatic gain control (AGC) is often used with amplification circuitry to control the amplitude of amplified signals. In radio receivers, for example, communication signals received are amplified for further signal processing. These received signals may be of varying signal strength. If amplified without automatic gain control, the resultant signals may have too much or too little gain, with a corresponding fluctuation of signal amplitudes. Variations in signal amplitude may cause significant problems in circuitry attempting to recover information present in the received signals. Accordingly, an AGC circuit is usually employed in an effort to present a signal with relatively constant amplitude.

A typical AGC circuit detects amplitude changes in a signal to be amplified and controls the gain of the amplification stage such that if the input signal strength diminishes, the amplification gain is increased, and if the input signal strength increases, the gain of the amplification stage decreases. Thus, the automatic gain controller attempts to control the output of the amplification stage such that a signal has a relatively constant amplitude output. This type of AGC is common in communication circuitry.

AGC circuits are often implemented using analog signal processing techniques. Generally, a feedback system is used in which the amplitude or energy level of the output signal from the amplifier is compared against a desired reference value, such as a reference voltage. Depending on the comparison results, a feedback signal is coupled to the amplifier to vary its gain. Circuitry in the feedback system controls the attack time and release time of the AGC. For example, a resistor capacitor combination is typically used to provide a fixed time constant for the release, where the selected value of the capacitor represents a trade off between the lowest frequency and the response time required. Automatic level controllers, limiters, and compressors have construction based on the same principles.

A major problem with analog automatic gain controllers or level controllers is that they suffer from a trade off between release time and the lowest frequency of operation. Analog gain loops also suffer from instability and settling time issues. Digital control AGC circuits avoid many issues associated with analog circuits, such as by using counters and time out timers to control attack and release time. However, prior art digital AGC circuits usually involve microprocessors or digital signal processors that add substantial cost and complexity to a design, and require increase power consumption over analog implementations.

It is desirable to have an improved apparatus and method for providing automatic gain control, automatic level control, that offer the flexibility in attack and release time of digital circuits, while offering the relative simplicity of analog circuits. Therefore, a new method and apparatus for automatic level or gain control is needed.

BRIEF DESCRIPTION OF THE DRAWINGS

FIG. 4 is a block diagram of a self-clocking digital automatic gain control circuit, in accordance with the present invention.

DETAILED DESCRIPTION OF THE PREFERRED EMBODIMENT

Figure 1:
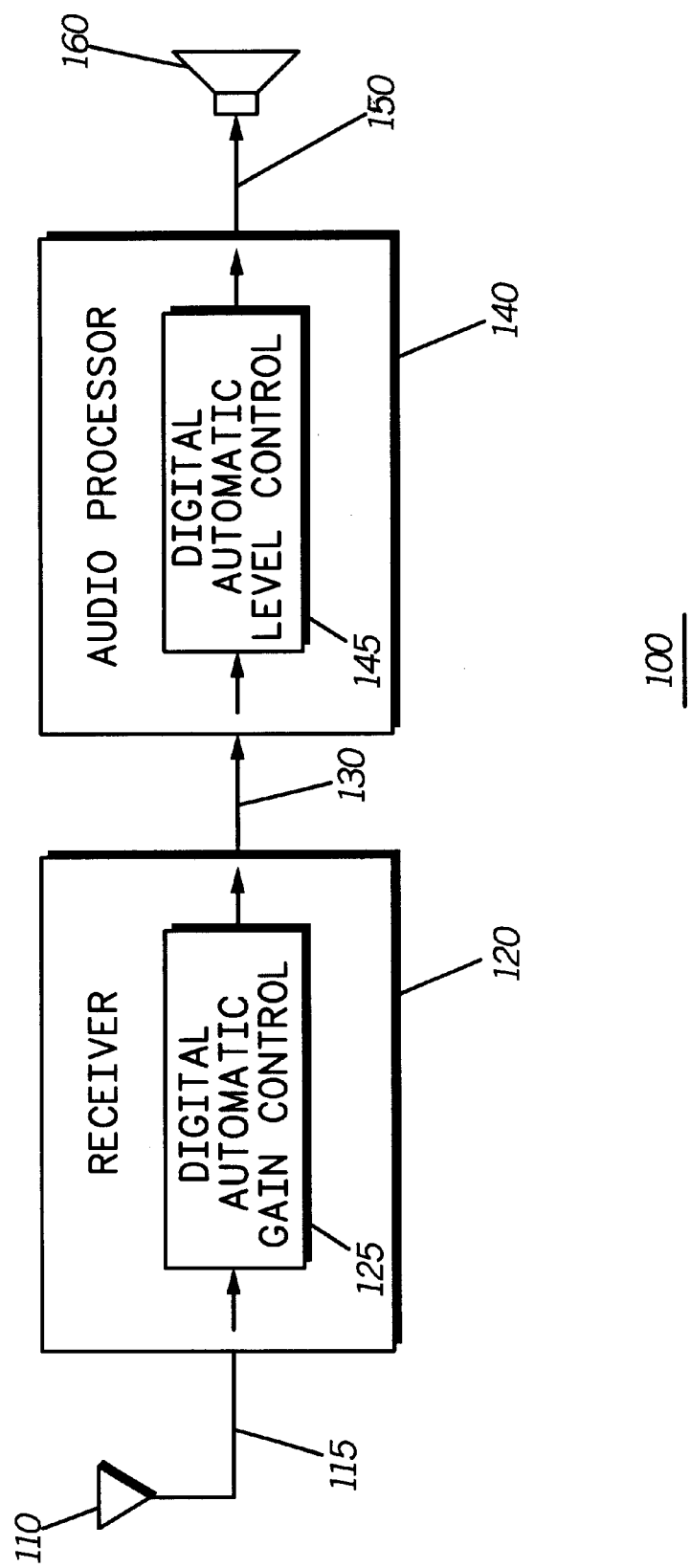
FIG. 1 is a block diagram of a radio communication device, in accordance with the present invention.

While the specification concludes with claims defining the features of the invention that are regarded as novel, it is believed that the invention will be better understood from a consideration of the following description in conjunction with the drawing figures, in which like reference numerals are carried forward.

The present invention provides for automatic digital level control for an input signal, based on a clock signal derived from the input signal. A digital signal adjuster such as a digital variable amplifier, attenuator, or the like, adjusts signal level for the input signal based on a digital level control input, to obtain an output signal. The digital level control input is automatically adjusted at a rate dependent on the clock signal until the input signal is adjusted to a reference signal level threshold. Preferably, a clock signal generator generates a clock signal based on transitions of the input signal (or output signal) across a predetermined zero reference level, such that the clock signal is dependent on characteristics of the input signal rather than information decoded from the input signal. The signal level of the input signal to, or alternatively, the output signal from, the signal adjuster is compared with the reference signal level to determine whether an adjustment of the digital level control input is needed. Adjustments are preferably made in response to the clock signal, which may be divided down, or otherwise scaled, by different factors to effect a different attack time and release time. In the preferred embodiment, adjustments are made as the input signal crosses a zero voltage reference threshold, so as to minimize switching noise introduced into the output signal.

FIG. 1 shows a radio communication device 100 having signal processing in accordance with the present invention. The radio 100 is an electronic communication device capable of receiving radio frequency (RF) signals, and transforming them into audio output using well-known principles. The radio 100 has a receiver 120 that processes a modulated analog information signal 115 received as a radio frequency signal through an antenna 110. The receiver 120 provides a demodulated signal 130 to an audio processor 140, which processes the demodulated signal to generate an audio signal 150 for a speaker 160. In accordance with the present invention, the radio 100 includes self-clocking automatic level control in the form of a digital automatic gain control module 125 used in the receiver 120, and a digital automatic level control module 145 used in the audio processor 140. Both modules 125, 145, operate as self-clocking digital devices that derive their clock signal from the information signal being processed.

Figure 2:
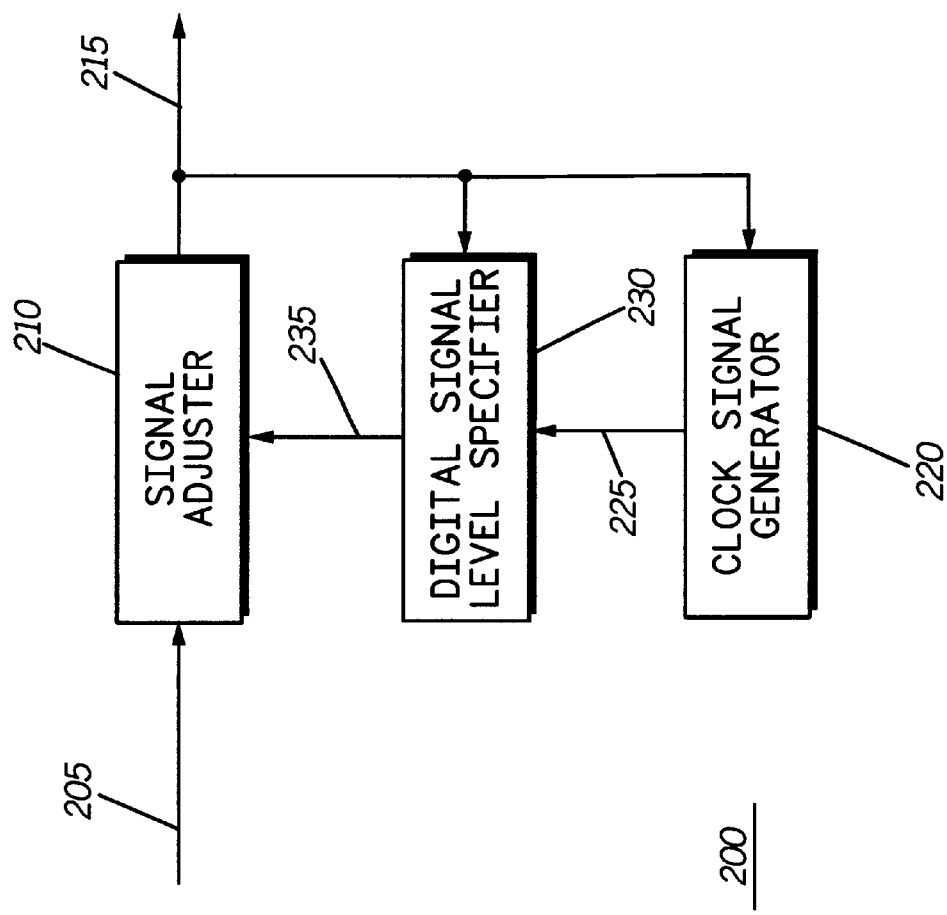
FIG. 2 is a block diagram showing functional units of a self-clocking automatic digital level control device, in accordance with the present invention.

FIG. 2 shows high level functional blocks of a self-clocking automatic digital level control device 200, such as the automatic gain control 125 or the automatic level control device 145 of FIG. 1. The digital level control device 200 includes a signal adjuster 210 that operates on an input information signal 205 to control, manipulate, or adjust its signal level to generate a modified version of the information signal 215 as an output signal. The signal level adjuster 210 adjusts signal level based on a digital level control input 235.

A digital signal level specifier 230, provides the digital level control input 235 to the signal level adjuster 210. The digital level control input 235 specifies the attenuation level or gain level to be applied to the information signal 205, so as to obtain the output signal 215. In accordance with the present invention, the signal level specifier 230 is a digital device that is driven by a clock signal derived from the information signal. Accordingly, a clock signal generator 220 is coupled to the adjusted information signal 215, and provides a clock signal 225 to the signal level specifier 230. Although shown coupled to the processed information signal, i.e., the output signal 215, the clock signal generator could be alternatively coupled to the unprocessed input signal 205. The clock signal is deemed to be derived from the information signal 205, whether or not there is intervening processing of the information signal prior to the generation of the clock signal.

In the preferred embodiment, the signal level specifier 230 is coupled to the output signal 215, and determines a specific digital level control input 235 based on a desired signal level for the output signal 215, and the actual signal level of the output signal 215. Those skilled in the art would readily appreciate that the signal level specifier could alternatively receive signal level information by being coupled to the information signal 205. The signal level specifier operates to automatically adjust the digital level control input 235 at a rate dependent on the clock signal 225 derived from the information signal, such that the modified information signal, i.e., output signal 215 has the desired signal level.

In short, the signal adjuster is responsive to the information signal 205 to generate an output signal 215 that represents the information signal with an adjusted signal level. The clock signal generator 220 generates a clock signal 225 based on transitions of the information signal 205, and the signal level specifier 230 adjusts the digital level control input 235 at a rate dependent on the clock signal.

Figure 3:
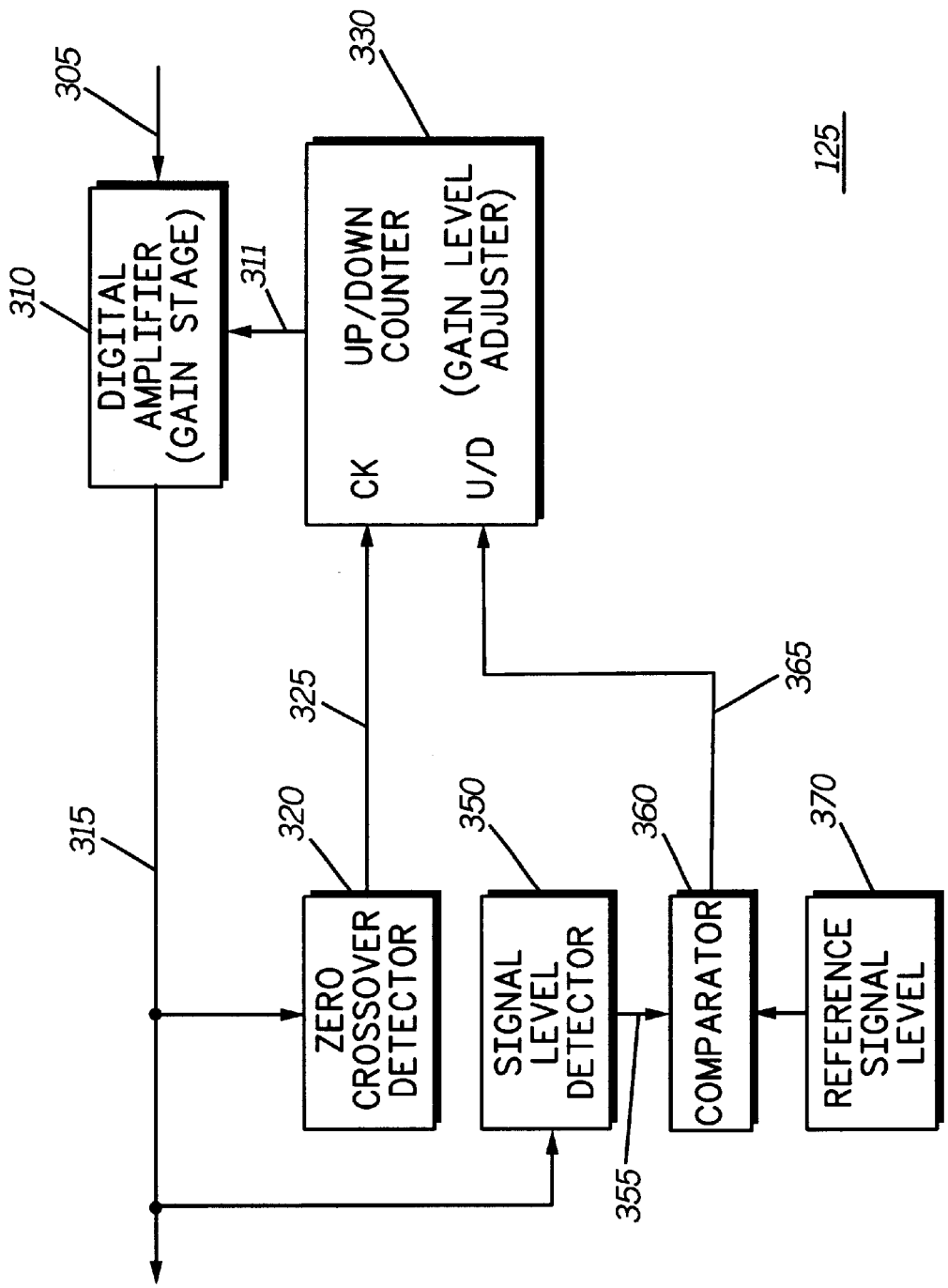
FIG. 3 is a block diagram of a self-clocking digital automatic gain control circuit, in accordance with the present invention.

FIG. 3 shows functional blocks of the digital automatic gain control circuit 125 used in the receiver 120 of FIG. 1, in accordance with the present invention. A digital amplifier 310, functions as a gain stage, that is responsive to an analog information signal 305 to generate an output signal 315 that is amplified. In practice, the amplifier 310 could embody multiple gain stages. The digital amplifier 310 has an input 311 for specifying gain level. In the preferred embodiment, the digital amplifier operates as a step gain controller that amplifies and attenuates, in a step wise mode, the input information signal 305 to generate the output signal 315. A signal level detector 350 is coupled to the output signal 315 and provides an output signal level 355. A comparator 360 compares the output signal level 355 with a reference signal level 370 and generates a control signal 365 that represents whether the output signal level is above or below the reference signal level 370. A zero crossover detector 320 is coupled to the output signal 315 and generates a clock signal based on transitions in the analog information signal. Preferably the clock signal is based on transitions of the analog signal across a predetermined zero reference level, i.e. zero crossings. An up/down counter 330 is coupled to the signal level detector 350 and to the comparator 360. The up/down counter 330 functions as a gain level adjuster that operates to adjust the input gain level 311 at a rate dependent on the clock signal, when the output signal level 315 is not consistent with the reference signal level. The up/down counter 330 has inputs coupled to the comparator 360 and to the zero crossover detector and an output coupled to the digital input of the variable amplifier. The up/down counter is responsive to the output from the comparator to adjust the digital level control input at a rate dependent on the clock signal, when the output signal level is inconsistent with the desired signal level.

One skilled in the art would appreciate that the above described functional blocks represent logical groupings and not necessarily physical groups, and thus may be implemented in a variety of ways. For example, in applications such as amplitude modulation (AM) radios, the function of the comparator may be provided by a threshold detector in the demodulator.

FIG. 4 shows functional blocks of the self-clocking automatic digital level control module 145 used in the audio processor module 140 of FIG. 1, such as the in accordance with the present invention. Functional blocks having reference numerals carried over from FIG. 3 have the same functionality as described therefor. Here, a digital attenuator 410 operates to adjust an information signal 405 to generate an output signal 415. Here, the signal 405 is modulated or encoded with audio information. A digital delay mechanism 480, 490, operates to alter the clock rate relative to the clock signal 325 derived from the information signal 405 by the zero crossover detector 320. A divide-by-N module 480 is coupled to the clock signal 325 to generate a divided clock signal 485. The clock signal 325 and divided clock signal 485 are inputs to a multiplexer 490. The control signal 365 from the comparator 360 is used to select the original clock signal 325 or the divided clock signal 485 depending on whether the detected signal level is greater than or less than the reference signal level. This control signal 365 is also used to determine up or down status of the up/down counter 330. In the preferred embodiment, the attenuator 410 and up/down counter 330 are implemented using a Dallas Semiconductor DS 1666 circuit module.

In short, a signal level for an information signal is adjusted based on a digital level control input to obtain a modified information signal. The digital level control input is automatically adjusted at a rate dependent on a clock signal generated from the information signal until the modified information signal has a desired signal level. The clock signal is generated based on transitions of the information signal across a particular signal level threshold, such as a predetermined zero reference threshold. The signal level of the modified information signal is compared with the desired signal level and the digital control input is adjusted up at a particular rate when the signal level of the modified information signal is less than the desired signal, and adjusted down at another rate which may be different from the first rate, when the signal level of the modified information signal is greater than the desired signal level. Preferably, the digital level control input is adjusted at zero crossings of the information signal.

The present invention offers significant advantages over the prior art. By basing the clock signal for digital functions associated with automatic level control on the signal being processed, the response of the circuit, i.e., the attack and release time, is directly proportional to the fundamental frequency of the signal being processed. Thus, as the frequency increases, the circuitry response time increases, and vice versa. Attack and release times can be proportionally varied. Yet, such benefits are provided without the complexity and noise problems associated with digital circuitry. Gain changes can be made at zero crossover points to avoid distortion and switching noises. Potential applications include automatic level control for a step gain controller, a digital-to-analog converter, a digital attenuator, a digital potentiometer, a digital volume control, a digital amplifier, among others. One skilled in the art would also recognize that the automatic level control method and apparatus described herein are applicable to compandor, compressor, and limiter applications.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as defined by the appended claims.

What is claimed is:

1. A self-clocking automatic digital level control apparatus, comprising:
   a signal adjuster responsive to an information signal to generate an output signal that represents the information signal with an adjusted signal level, the signal adjuster having a digital level control input for a desired signal level for the output signal;
   a clock signal generator that generates a clock signal based on transitions of the information signal; and
   a signal level specifier that adjusts the digital level control input at a rate dependent on the clock signal.

2. The apparatus of claim 1, wherein the clock signal is based on transitions of the information signal across a particular threshold.

3. The apparatus of claim 2, wherein the clock signal is based on zero crossings of the information signal of a predetermined zero reference level.

4. The apparatus of claim 1, further comprising:
   a signal level detector coupled to the output signal and providing an output signal level;
   a comparator having an output based on a comparison between the output signal level and a reference signal level; and
      wherein the signal level specifier is coupled to the comparator, and adjusts the digital level control input up or down depending on the output of the comparator, at a rate dependent on the clock signal.

5. The apparatus of claim 4, wherein the signal level specifier adjusts the digital level control input at a first rate when the output signal level is less than the reference signal level, and at a second rate different from the first rate, when the output signal level is greater than the reference signal level, and wherein the first rate and the second rate are derived from the clock signal.

6. The apparatus of claim 1, wherein the signal level specifier comprises an up/down counter.

7. The apparatus of claim 1, wherein signal adjuster comprises a variable attenuator.

8. The apparatus of claim 1, wherein signal adjuster comprises a variable amplifier.

9. An electrical apparatus, comprising:
   a signal adjuster having an input of a first analog signal, an input of digital data, and an output of a second analog signal derived from the first analog signal based at least in part on the digital data; and
   a digital module coupled to the signal adjuster and providing the digital data thereto, the digital module being clocked by a clock signal derived from either of the first analog signal or the second analog signal.

10. The electrical apparatus of claim 9, wherein the signal adjuster is a digital variable amplifier.

11. The electrical apparatus of claim 9, wherein the signal adjuster is a digital variable attenuator.

12. The electrical apparatus of claim 9, wherein the digital module provides the digital data at a rate dependent on the clock signal.

13. The electrical apparatus of claim 12, wherein the clock signal is generated based on transitions across a zero reference threshold of either of the first analog signal or the second analog signal.

14. An electrical apparatus for processing an information signal, comprising:
   a gain stage responsive to the information signal to generate an output signal that is amplified, the gain stage having an input gain level;
   a signal level detector coupled to the output signal and providing an output signal level;
   a comparator that compares the output signal level with a reference signal level;
   a zero crossover detector that generates a clock signal based on transitions in the information signal; and
   a gain level adjuster coupled to the signal level detector and to the comparator, and operable to adjust the input gain level at a rate dependent on the clock signal, when the output signal level is not consistent with the reference signal level.

15. A radio, comprising:
   a radio circuit that provides an information signal;
   a variable amplifier responsive to the information signal to generate an output signal that is an amplified version of the information signal, the variable amplifier having a digital input that specifies gain level;
   a signal level detector coupled to the output signal and providing an output signal level;
   a comparator having an output based on a comparison between the output signal level and a desired signal level;
   a clock signal generator that generates a clock signal based on transitions of the information signal across a particular threshold; and
   a gain level adjuster having inputs coupled to the comparator and to the clock signal generator, and having an output coupled to the digital input of the variable amplifier, the gain level adjuster being responsive to output from the comparator to adjust gain level of the variable amplifier at a rate dependent on the clock signal, when the output signal level is inconsistent with the desired signal level.

16. The radio of claim 15, wherein the radio circuit comprises a receiver circuit and the information signal comprises a received modulated signal.

17. An electrical apparatus for processing an information signal, comprising:
   a signal level adjuster having as input the information signal and having an output signal based on the information signal, the signal level adjuster having a digital level control input;
   a signal level detector coupled to the output signal and providing an output signal level;
   a comparator having an output based on a comparison between the output signal level and a desired signal level;
   a clock signal generator that generates a clock signal based on transitions of the information signal across a particular threshold; and an up/down counter having inputs coupled to the comparator and to the clock signal generator, and having an output coupled to the digital level control input of the signal level adjuster, the up/down counter being responsive to the output from the comparator to adjust the digital level control input at a rate dependent on the clock signal, when the output signal level is inconsistent with the desired signal level.

18. A method for self-clocking automatic digital level control, comprising the steps of:

adjusting signal level for an information signal, based on a digital level control input that specifies the desired signal level, to obtain a modified information signal; and automatically adjusting the digital level control input at a rate dependent on a clock signal derived from the information signal until the modified information signal has a desired signal level.

19. The method of claim 18, further comprising the step of generating the clock signal based on transitions of the information signal across a particular signal level threshold.

20. The method of claim 19, further comprising the step of comparing signal level of the modified information signal with the desired signal level, and wherein the step of adjusting the digital level control input comprises the steps of:

adjusting the digital level control input level up at a first rate when the signal level of the modified information signal is less than the desired signal level; and adjusting the digital level control input level down at a second rate different than the first rate when the signal level of the modified information signal is greater than the desired signal level.

21. The method of claim 18, further comprising the step of generating the clock signal based on zero crossings of the information signal.

22. The method of claim 18, further comprising the step of generating the clock signal based on zero crossings of the information signal.

23. The method of claim 18, wherein the step of adjusting signal level further comprises the step of amplifying the information signal.

24. The method of claim 18, wherein the step of adjusting signal level further comprises the step of attenuating the information signal.

25. The method of claim 18, wherein the information signal comprises a modulated analog signal.

26. In a radio communication device, a method for maintaining an information signal at a desired signal level, comprising the steps of:

adjusting signal level of the information signal, based on a digital input that specifies the signal level, to obtain an output signal representing a modified version of the information signal;

generating a clock signal based on transitions of the information signal across a particular threshold;

determining that the output signal has a signal level different than the desired signal level; and adjusting the digital input in response to the clock signal such that the signal level of the output signal approaches the desired signal level.

27. The method of claim 26, wherein the step of generating a clock signal comprises the step of detecting zero crossings of the information signal, and the step of adjusting the digital input comprises the step of adjusting the digital input at on zero crossings of the information signal.

28. In a radio communication device, a method for maintaining an information signal at a desired signal level, comprising the steps of:

amplifying signal level of the information signal, based on a signal level input, to obtain an output signal representing a modified version of the information signal;

generating a clock signal at each transition of the information signal across a particular threshold;

determining that the output signal has a signal level different than the desired signal level; and adjusting the signal level input using a digital component clocked by the clock signal such that the signal level of the output signal approaches the desired signal level.

29. A method, comprising the steps of:

processing a modulated analog signal with a variable attenuator to generate an output signal, the variable attenuator having as an input a digital attenuation level;

obtaining a signal level for the output signal;

comparing the signal level of the output signal against a reference threshold representative of a desired signal level;

obtaining a clock signal from zero crossings of the modulated analog signal;

increasing the digital attenuation level at a first rate based on the clock signal when the signal level of the output signal is below desired signal level; and decreasing the digital attenuation level at a second rate different from the first rate, which second rate is based on the clock signal.

30. A method, comprising the steps of:

adjusting signal level of an input signal to obtain an output signal therefrom, the output signal having a fundamental frequency characteristic thereof; and adjusting the signal level at a rate based on the fundamental frequency of the output signal.

* * * * *